United States Patent
Delgadino et al.

(10) Patent No.: US 7,432,209 B2
(45) Date of Patent: Oct. 7, 2008

(54) PLASMA DIELECTRIC ETCH PROCESS INCLUDING IN-SITU BACKSIDE POLYMER REMOVAL FOR LOW-DIELECTRIC CONSTANT MATERIAL

(75) Inventors: Gerardo A. Delgadino, Santa Clara, CA (US); Richard Hagborg, Felton, CA (US); Douglas A. Buchberger, Jr., Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/386,428

(22) Filed: Mar. 22, 2006

(65) Prior Publication Data
US 2007/0224826 A1    Sep. 27, 2007

(51) Int. Cl.
*H01L 21/76*    (2006.01)
(52) U.S. Cl. .............. 438/709; 438/709; 438/725; 438/731; 430/329; 430/311; 430/313; 134/1.1; 216/41; 216/67; 216/70
(58) Field of Classification Search ........... 438/709; 430/329; 216/41
See application file for complete search history.

(56) References Cited

U.S. PATENT DOCUMENTS

| | | | |
|---|---|---|---|
| 5,834,371 A * | 11/1998 | Ameen et al. ............. 438/656 |
| 6,024,888 A | 2/2000 | Watanabe et al. ............. 216/73 |
| 6,417,083 B1 | 7/2002 | Mori ........................... 438/585 |
| 6,680,164 B2 * | 1/2004 | Nguyen et al. .............. 430/329 |
| 6,733,594 B2 | 5/2004 | Nguyen ........................ 134/6 |
| 6,777,334 B2 | 8/2004 | Shiu et al. .................... 438/689 |
| 6,991,739 B2 * | 1/2006 | Kawaguchi et al. ............ 216/67 |
| 7,141,757 B2 * | 11/2006 | Hoffman et al. ........ 219/121.43 |
| 7,276,447 B1 | 10/2007 | Delgadino et al. ........... 438/694 |
| 2006/0051967 A1 * | 3/2006 | Chang et al. ................ 438/710 |

\* cited by examiner

*Primary Examiner*—Shamim Ahmed
*Assistant Examiner*—Maki Angadi
(74) *Attorney, Agent, or Firm*—Law Office of Robert M. Wallace

(57) ABSTRACT

A plasma etch process with in-situ backside polymer removal begins with a workpiece having a porous or non-porous carbon-doped silicon oxide dielectric layer and a photoresist mask on a surface of the workpiece. The workpiece is clamped onto an electrostatic chuck in an etch reactor chamber. The process includes introducing a fluoro-carbon based process gas and applying RF bias power to the electrostatic chuck and RF source power to an overhead electrode to etch exposed portions of the dielectric layer while depositing protective fluoro-carbon polymer on the photoresist mask. The process further includes removing the fluoro-carbon based process gas and introducing a hydrogen-based process gas and applying RF source power to the overhead electrode. The lift pins in the electrostatic chuck are extended to raise the workpiece above the electrostatic chuck and expose a backside of the workpiece to plasma in the reactor chamber, so as to reduce polymer previously deposited on the backside, until the polymer has been removed from the backside.

18 Claims, 2 Drawing Sheets

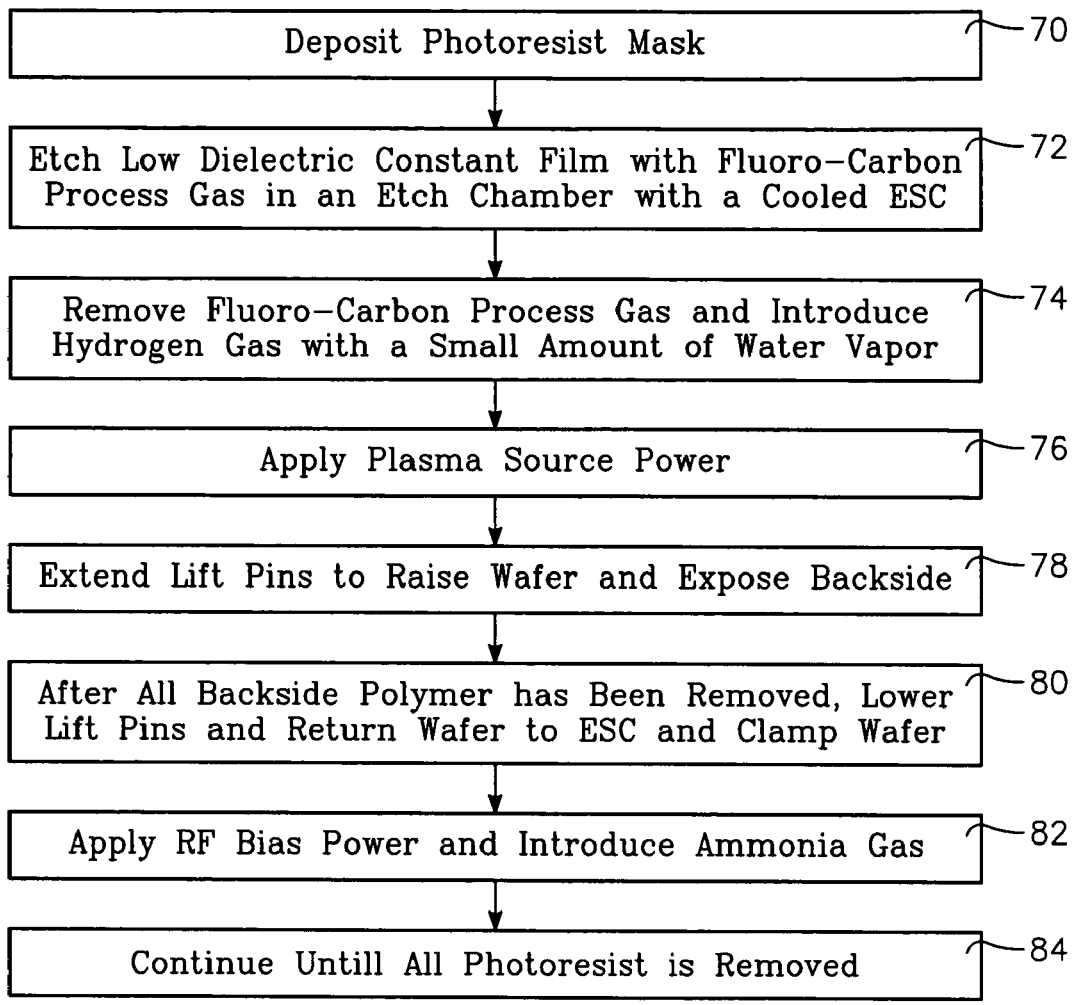
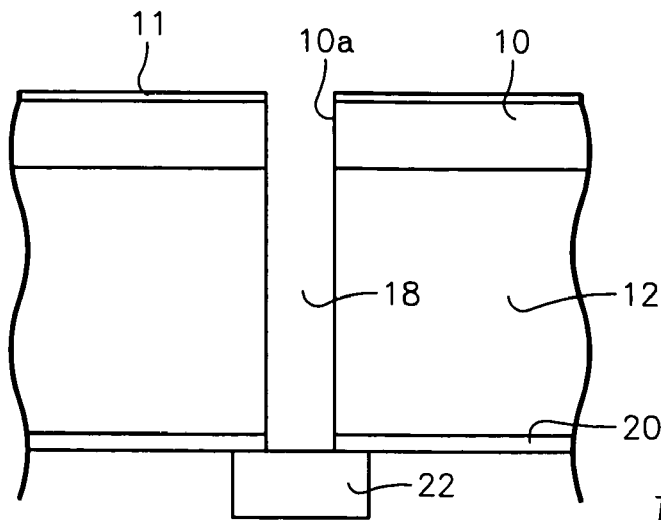
FIG. 1
FIG. 2

PLASMA DIELECTRIC ETCH PROCESS INCLUDING IN-SITU BACKSIDE POLYMER REMOVAL FOR LOW-DIELECTRIC CONSTANT MATERIAL

BACKGROUND OF THE INVENTION

Integrated circuit performance is being continually improved by increasing device switching speed, increasing interconnection density and reducing cross-talk between adjacent conductors. Switching speeds have been increased and cross-talk reduced by employing new dielectric thin film material having low dielectric constant, such as porous carbon-doped silicon dioxide. Interconnections have been increased by increasing the number of interconnected conductive layers and reducing feature size (e.g., line widths, hole diameters). Connecting between such deep layers entails high aspect ratio (deep and narrow) conductor openings or "vias". Such fine features have required photoresist (for photolithography) adaptable to shorter wavelengths. Such photoresist tends to be thinner and more prone to form imperfections such as pin holes or striations during the dielectric etch process. This problem is addressed by employing a fluoro-carbon chemistry during the plasma etch of the dielectric inter-layer insulation film, in order to deposit a protective fluorocarbon polymer on the photoresist. The polymer must be removed from the wafer after the etch process in order to avoid contaminating later process steps that must be performed on the wafer. Therefore, a post-etch polymer removal step is performed. However, in the post-etch polymer removal step, it is difficult to remove all of the deposited polymer. This is because some polymer penetrates through a gap between the wafer edge and a ring collar process kit at the wafer pedestal periphery, and accumulates on the wafer backside at the periphery. Such a gap is required to avoid interference with the electrostatic chuck (ESC) that forcibly clamps the wafer to a cooled surface to meet the temperature control requirements of the plasma etch process. The wafer edge-to-ring collar gap is too narrow for plasma to penetrate and remove the polymer from the wafer backside during the post-etch polymer removal step. Therefore, a conventional approach to this problem has been to employ an oxygen plasma in the post-etch polymer removal step, to oxidize carbon-containing materials (such as polymer and photoresist), followed by dipping the wafer in liquid HF acid. This step can employ a separate relatively inexpensive "ashing" chamber having a heated wafer support pedestal capable of relatively high wafer temperatures (e.g., 300 or more degrees) with a simple remote plasma source. This process does not harm a conventional dielectric material such as silicon dioxide, which is a strong material. However, such an oxidizing process does catastrophic harm to the newer low dielectric constant insulator materials such as porous carbon-doped silicon dioxide. The oxidizing chemistry of the post-etch clean step removes the carbon from the carbon-doped silicon dioxide dielectric material, the carbon eventually being replaced by water from the atmosphere. This greatly increases the dielectric constant of the insulator, removing its main advantage. Such damage is apparent as undercutting of the dielectric layer sidewalls viewed in a profile image. This undercutting is revealed upon dipping the wafer in dilute acid following the post-etch clean step. Another problem is that such an oxidizing process does not completely remove the backside polymer, even after 60 seconds, according to our investigation.

Therefore, what is needed is a way of completely and quickly removing polymer from the wafer backside that does not damage the low-dielectric constant insulator material without requiring any extra process time.

SUMMARY OF THE INVENTION

A plasma etch process with in-situ backside polymer removal begins with a workpiece having a porous carbon-doped silicon oxide dielectric layer and a photoresist mask on a surface of the workpiece. The workpiece is clamped onto an electrostatic chuck in an etch reactor chamber. The process includes introducing a fluoro-carbon based process gas and applying RF bias power to the electrostatic chuck and/or RF source power to an overhead electrode to etch exposed portions of the dielectric layer while depositing protective fluoro-carbon polymer on the photoresist mask. The process further includes removing the fluoro-carbon based process gas and introducing a hydrogen-based process gas and applying RF source power to the overhead electrode. The lift pins in the electrostatic chuck are extended to raise the workpiece above the electrostatic chuck and expose a backside of the workpiece to plasma in the reactor chamber, so as to reduce polymer previously deposited on the backside, until the polymer has been removed from the backside.

BRIEF DESCRIPTION OF THE DRAWINGS

FIG. 1 is a block flow diagram depicting a process embodying the invention.

FIG. 2 depicts a device formed by the process of FIG. 1.

DETAILED DESCRIPTION OF THE INVENTION

Figure 3:
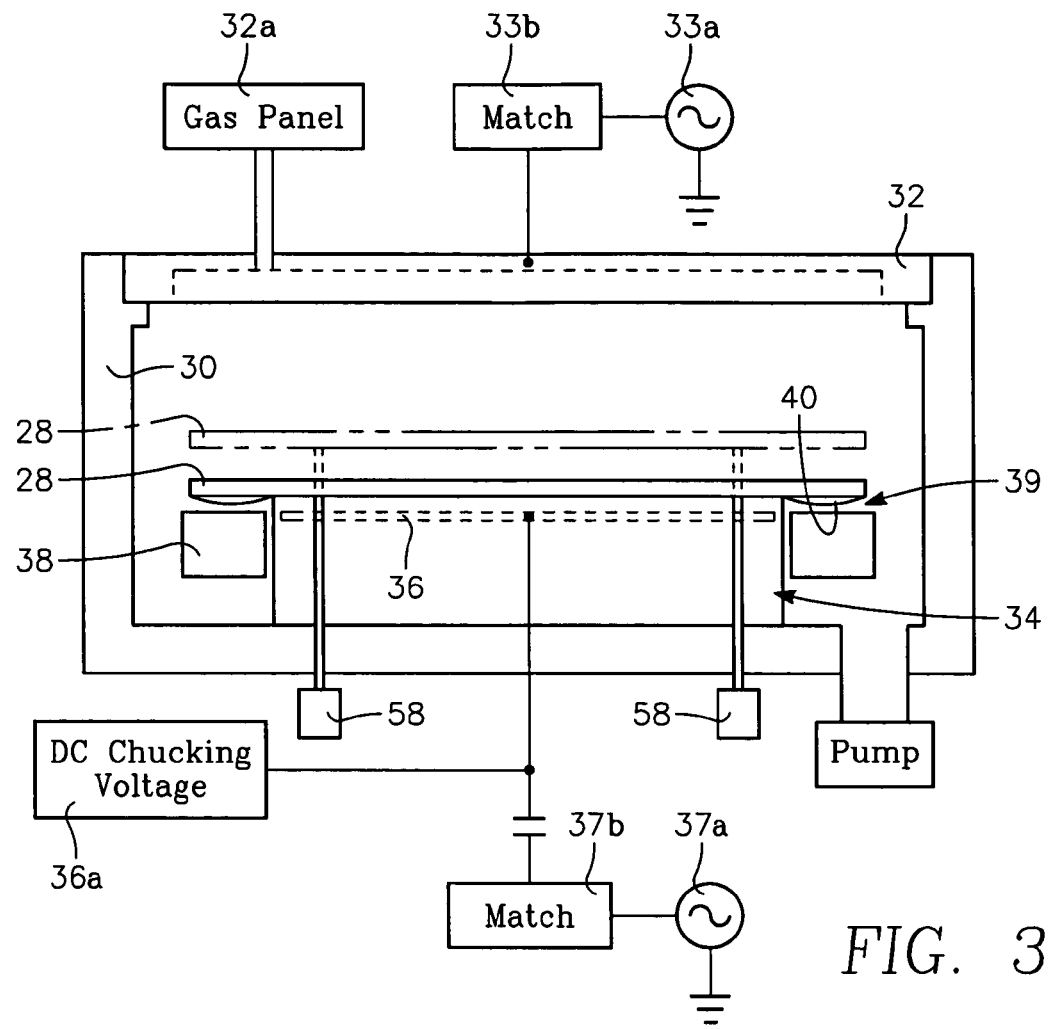
FIG. 3 depicts a preferred plasma etch reactor for carrying out the invention.

The invention is based upon our discovery of an etch process for a low dielectric constant material including a post etch polymer removal step that thoroughly removes backside polymer with no damage to the low dielectric constant insulator layer (e.g., porous carbon-doped silicon dioxide), and does so in less than 60 seconds. An etch process embodying the invention is depicted in FIG. 1, while FIG. 2 depicts one example of a thin film structure that can be formed using the process of FIG. 1. A photoresist mask 10 depicted in FIG. 2 is deposited on a dielectric layer 12, the mask 10 having an aperture 10a corresponding to a feature 18 that is to be etched in the dielectric layer 12. This corresponds to the step of block 70 of FIG. 1. The feature may be a narrow via 18. The via 18 extends through the dielectric layer 12 and through a barrier layer 20 to expose the top surface of a copper line 22. The dielectric layer is a low dielectric constant material, such as porous carbon-doped silicon dioxide or porous organo-silicate material. The barrier layer 20 may be a low dielectric constant material such as nitrogen doped silicon carbide that is capable of blocking diffusion of metal (copper) atoms through the thin film structure. In the step of block 72 of FIG. 1, the via 18 of FIG. 2 is formed by etching away the portion of the dielectric material 12 lying below the opening in the photoresist layer 10, using a plasma of a fluoro-carbon-containing process gas. This step is carried out in a plasma etch reactor, such as a capacitively coupled plasma etch reactor of the type depicted in FIG. 3 for processing a wafer 28. The etch reactor of FIG. 3 has a sidewall 30, an overhead electrode/gas showerhead 32 fed by a gas panel 32a and RF-driven by an RF plasma source power generator 33a through an impedance match 33b, an electrostatic chuck 34 with an internal electrode 36 controlled by a D.C. chucking voltage controller 36a and driven by an RF bias generator 37a through an impedance match 37b, and a ring collar 38 or process kit underlying the peripheral portion of the wafer 28 extending beyond the chuck 34. The wafer 28 may be lifted (dashed line wafer 28 of FIG. 3) and lowered (solid line wafer 28 of FIG. 3) onto the electrostatic chuck 34 by conventional lift pins 58. While the wafer 28 is clamped to the electrostatic chuck 34, the gap 39 between the collar 38 and the backside of the wafer 28 prevents interference by the collar 38 with wafer-clamping function of the electrostatic chuck 34 when a D.C. chucking voltage is applied to the electrode 36. During the etch step of block 72 of FIG. 1, the fluoro-carbon process gas dissociates into simple fluoro-carbon etch species and heavier or carbon-rich polymer-forming species that form a protective layer 11 on the photoresist 10 of FIG. 2. The polymer-forming species travel through the wafer-collar gap to form an annular backside polymer layer 40 on the backside of the wafer 28.

In the next step, block 74 of FIG. 1, the fluoro-carbon process gas is removed from the etch reactor chamber and replaced with a hydrogen process gas with a small proportion of water vapor. Plasma source power (e.g., 162 MHz RF power) is applied to the ceiling electrode 32 (block 76 of FIG. 1). Before the source power is applied, the lift pins 58 are extended to lift the wafer 28 above the electrostatic chuck 34 to expose the wafer backside (block 78 of FIG. 1). (Alternatively, the order of steps of blocks 76 and 78 may be reversed.) As a result, a reducing plasma is generated in the chamber that reduces carbon in the backside polymer film 40 to remove this film. The reducing agent is hydrogen. It is preferable to include water vapor in the hydrogen process gas because it has been found that the population of free hydrogen in the chamber is increased more with the addition of water than with the addition of further hydrogen. We have observed this phenomenon with optical emission spectrometry, which indicates a disproportionate increase in the hydrogen line magnitude with the addition of water vapor. This increase in hydrogen in the etch reactor chamber increases the rate at which polymer is reduced.

The wafer 28 is held in the lifted position by the lift pins 58 in the reducing plasma for a very short period of time (e.g., 60 seconds), during which all of the backside polymer film 40 is completely removed.

It is a discovery of the present invention that a reducing chemistry (i.e., the hydrogen process gas) may be employed to completely remove backside polymer in less than 60 seconds. Apparently, the hydrogen in the process gas reduces carbon in the polymer by forming hydro-carbon compounds, but performs very little or no reduction of the carbon in the porous carbon-doped silicon dioxide dielectric material (the insulator layer 12 of FIG. 2).

Figure 4:
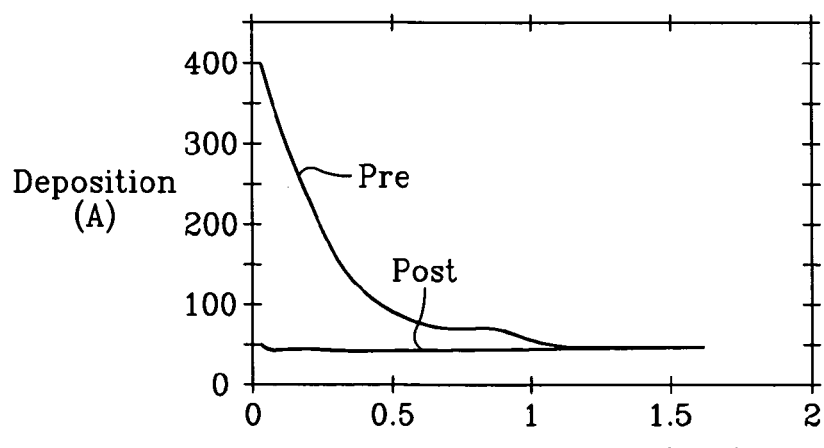
FIG. 4 is a graph depicting the radial distribution of polymer thickness obtained in the invention (flat line) and before the polymer removal; step (curved line).

The steep curve of FIG. 4 corresponds to the initial condition of the wafer backside and indicates a large amount of backside polymer. The flat curve of FIG. 4 was obtained after the polymer removal step, in which a reducing chemistry is employed in the etch reactor of FIG. 3, and indicates a complete removal of all backside polymer without requiring transfer of the wafer 28 from the etch reactor. Thus, one surprising result is that the reducing chemistry works effectively without an external heat source (like a heated substrate). Another surprising result is that the reducing chemistry causes no observable damage to the low dielectric constant insulator material 12 (whereas the oxidizing chemistry causes catastrophic damage to the low dielectric constant insulator material). Damage to porous carbon-doped silicon dioxide dielectric thin film was ascertained in our investigations by carrying out the dielectric etch step, then carrying out the backside polymer removal step and finally dipping the wafer in dilute HF. Thereafter, a scanning electron microscope image of the etch profile was obtained. For those wafers processed using the conventional oxidizing post-etch polymer removal technique, the etch profile images revealed large undercutting of the etched structures. However, for those wafers in which the post etch backside polymer removal step employed a reducing chemistry, very little undercutting or damage to the porous carbon-doped silicon dioxide was visible in the SEM images of the etch profile, the undercutting being no more than 2 nm or less (a negligible amount). The most surprising result is that the polymer removal process using hydrogen gas and water vapor efficiently removes the entire backside polymer layer 40 (e.g., within 40 to 60 seconds) at relatively low temperature. In related co-pending U.S. application Ser. No. 11/402,074, filed Apr. 11, 2006 entitled PLASMA DIELECTRIC ETCH PROCESS INCLUDING EX-SITU BACKSIDE POLYMER REMOVAL FOR LOW-DIELECTRIC CONSTANT MATERIAL By Gerardo A. Delgadino, et al. and assigned to the present assignee, use of a hydrogen and water vapor process gas in removing backside polymer is performed after heating the wafer to a high temperature (e.g., 100 to 400 degrees C.), as it would be expected such a high temperature is required. The present invention, however, carries out the polymer backside removal step with hydrogen and water vapor chemistry in the etch reactor in which the low dielectric constant insulator film was etched in the preceding step. Such an etch reactor must be able to maintain the bulk wafer temperature at a low temperature (e.g., below 60-100 degrees C.), and therefore its electrostatic chuck 34 is incapable of heating the wafer beyond 60 degrees, and in fact is suited for cooling the wafer. Therefore, when the lift pin extension step of block 78 of FIG. 1 is performed lifting the wafer above the electrostatic chuck 34, the wafer is at a relatively cold temperature. Conventional expectation would be that the hydrogen and water vapor plasma chemistry would either require an inordinate amount of time to remove the backside polymer film 40 or would be unable to completely remove it. Our discovery is that the process is very efficient, removing all of the backside polymer film 40 within only 40 to 60 seconds, a surprising result. One reason that the polymer reducing (hydrogen-based) chemistry was so efficient despite the low wafer temperature may be that the RF source power applied to the overhead electrode 32 of FIG. 3 is of very high frequency (VHF) range, or 27 MHz to 400 MHz, and specifically in the present example 162 MHz, which tends to contribute a very large proportion of its power (about 90%) to ion dissociation in the plasma and therefore attains a very high degree of plasma ion dissociation and a large population of free hydrogen. Another reason may be that the backside polymer removal step is carried out at a relatively low pressure (e.g., 500 mT) as discussed below, so that the combination of low pressure and high dissociation expedites the process, obviating any need to heat the wafer. Conventional polymer removal processes have employed very high wafer temperatures in combination with very high chamber pressures (e.g., 2 Torr). Thus, our process departs from conventional practice to achieve surprising success by operating a low chamber pressure and relatively low wafer temperature.

In one example of the backside polymer removal step of blocks 74, 76 and 78, 2000 Watts of RF source power (e.g., at 162 MHz) was applied to the ceiling electrode 32 of the etch reactor of FIG. 3) while 2000 sccm of hydrogen gas and 100 sccm of water vapor was supplied by the gas panel 32a at a chamber pressure of 500 mT. This process removed the entire backside polymer film 40 (FIG. 3) in 60 seconds, the film 40 having reached 400 Angstroms in thickness prior to removal. We have found that 300 mT is an ideal pressure, (since our experiments indicate lower pressure increases dissociation) and that raising the chamber pressure to as high as 900 mT or reducing it below 30 mT yields inferior results. In general, the process gas is primarily pure hydrogen gas, a large portion of which dissociates into free hydrogen. Water vapor content is a fraction of the hydrogen content of the process gas, and is adjusted to maximize the free hydrogen content of the gas, as indicated by an optical emission spectrometer. The water vapor flow rate is typically only a fraction of the hydrogen gas flow rate, as little as one tenth or one twentieth of the hydrogen flow rate (as in the example above). It may be possible to eliminate the water vapor from the process gas, although such a choice is not preferred.

After all of the backside polymer film 40 of FIG. 3 has been removed (e.g., after about 40 to 60 seconds), the lift pins 58 are retracted to return the wafer 28 to the electrostatic chuck 34, and the wafer 28 is then electrostatically clamped to the chuck 34 (block 80 of FIG. 1). A further process step is then performed to remove photoresist that was not removed during the backside polymer removal step. The hydrogen-water process gas is replaced with ammonia process gas and RF bias power is applied to the electrostatic chuck 34 by the RF bias power generator 37*a* of FIG. 3 (block 82 of FIG. 1). This step is continued until all photoresist has been removed (block 84 of FIG. 1). This step removes any remaining photoresist from the wafer. If it is found that the backside polymer removal step of blocks 74, 76 and 78 of FIG. 1 has removed both the backside polymer 40 and the photoresist 10, then the photoresist removal steps of blocks 80, 82 and 84 may be eliminated.

The process of the invention is useful for etching both porous and non-porous The process if the invention is useful for etching both porous and non-porous carbon doped materials (such as carbon-doped silicon). It is also useful for etching other low k dielectric materials such as porous oxide (e.g., porous silicon dioxide). The etch process may be one for forming a via, a trench or a combination of the two.

What is claimed is:

1. A plasma etch process with in-situ backside polymer removal, comprising:
    providing a workpiece having a carbon-doped silicon oxide dielectric layer;
    defining a photoresist mask on a surface of the workpiece;
    clamping said workpiece onto an electrostatic chuck in an etch reactor chamber;
    introducing a fluoro-carbon based process gas and applying RF bias power to said electrostatic chuck and RF source power to an overhead electrode to etch exposed portions of the dielectric layer while depositing protective fluoro-carbon polymer on the photoresist mask; and
    removing said fluoro-carbon based process gas, cooling said workpiece to a temperature below 100 degrees C., reducing gas pressure in said chamber to below 500 mT and introducing a hydrogen-based process gas, extending lift pins in said electrostatic chuck to raise the workpiece above the electrostatic chuck to expose a backside of said workpiece to plasma in the reactor chamber and applying RE source power of a VHF frequency in a range of 27-400 MHz to said overhead electrode, so as to reduce polymer previously deposited on said backside, until the polymer has been removed from said backside.

2. The process of claim 1 wherein said RF source power applied to said overhead electrode upon introduction of said hydrogen-based process gas is of a VHF frequency over 100 MHz.

3. The process of claim 2 wherein said VHF frequency is about 162 MHz.

4. The process of claim 2 further comprising maintaining a chamber pressure during removal of said polymer from said backside at a low chamber pressure on the order of hundreds of milliTorr.

5. The process of claim 1 further comprising:
    removing said hydrogen-based process gas and introducing a photoresist removal process gas, and applying RF bias power to said electrostatic chuck so as to remove all photoresist from said workpiece.

6. The process of claim 1 wherein said hydrogen process gas contains pure hydrogen.

7. The process of claim 1 wherein said hydrogen process gas contains both hydrogen gas and water vapor.

8. The process of claim 1 wherein the step of introducing a hydrogen-based process gas comprises flowing hydrogen gas at a first rate and water vapor at a second rate into a plasma generating region, wherein said first rate exceeds said second rate.

9. The process of claim 8 wherein said first rate is more than ten times said second rate.

10. The process of claim 8 wherein said first rate is more than 20 times said second rate.

11. The process of claim 2 wherein the RF source power applied during the removal of polymer from said backside of said workpiece is on the order of about 2000 Watts.

12. A plasma etch process with in-situ backside polymer removal, comprising:
    providing a workpiece having a carbon-doped silicon oxide dielectric layer;
    defining a photoresist mask on a surface of the workpiece;
    clamping said workpiece onto an electrostatic chuck in an etch reactor chamber;
    introducing a fluoro-carbon based process gas and applying RF bias power to said electrostatic chuck and RF source power to an overhead electrode to etch exposed portions of the dielectric layer while depositing protective fluoro-carbon polymer on the photoresist mask; and
    removing said fluoro-carbon based process gas, cooling said workpiece to a temperature below 100 degrees C., reducing gas pressure in said chamber to below 500 mT and introducing a hydrogen-based process gas of hydrogen gas and a fractional additive amount of water vapor, and extending lift pins in said electrostatic chuck to raise the workpiece above the electrostatic chuck to expose a backside of said workpiece to plasma in the reactor chamber, and applying RF source power of a VHF frequency in a range of 27-400 MHz and power level on the order of thousands of Watts to said overhead electrode, so as to reduce polymer previously deposited on said backside, until the polymer has been removed from said backside.

13. The process of claim 12 further comprising:
    removing said hydrogen-based process gas and introducing a photoresist removal process gas, and applying RF bias power to said electrostatic chuck so as to remove all photoresist from said workpiece.

14. The process of claim 13 wherein said photoresist removal process gas is ammonia.

15. The process of claim 12 wherein the step of introducing a hydrogen-based process gas comprises flowing hydrogen gas at a first rate and water vapor at a second rate into a plasma generating region, wherein said first rate exceeds said second rate.

16. The process of claim 15 wherein said first rate is more than ten times said second rate.

17. The process of claim 15 wherein said first rate is more than 20 times said second rate.

18. The process of claim 12 wherein the RF source power applied during the removal of polymer from said backside of said workpiece is on the order of about 2000 Watts and said VHF frequency is about 162 MHz.

* * * * *